(12) United States Patent
Choy

(10) Patent No.: US 9,490,131 B2
(45) Date of Patent: Nov. 8, 2016

(54) CONTROL OF P-CONTACT RESISTANCE IN A SEMICONDUCTOR LIGHT EMITTING DEVICE

(71) Applicant: KONINKLIJKE PHILIPS N.V., Eindhoven (NL)

(72) Inventor: Kwong-Hin Henry Choy, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/762,023

(22) PCT Filed: Jan. 15, 2014

(86) PCT No.: PCT/IB2014/058275
§ 371 (c)(1),
(2) Date: Jul. 20, 2015

(87) PCT Pub. No.: WO2014/115060
PCT Pub. Date: Jul. 31, 2014

(65) Prior Publication Data
US 2015/0340563 A1     Nov. 26, 2015

Related U.S. Application Data

(60) Provisional application No. 61/756,107, filed on Jan. 24, 2013.

(51) Int. Cl.
*H01L 33/00* (2010.01)
*H01L 21/285* (2006.01)
(Continued)

(52) U.S. Cl.
CPC ..... *H01L 21/28575* (2013.01); *H01L 21/3228* (2013.01); *H01L 21/3245* (2013.01);
(Continued)

(58) Field of Classification Search
CPC ............... H01L 33/22; H01L 21/0254; H01L 21/02579; H01L 21/02664; H01L 21/28575; H01L 21/3228; H01L 21/3245; H01L 2933/0016; H01L 33/0095; H01L 33/145; H01L 33/20; H01L 33/40; H01L 33/405
USPC ............................. 257/98, 99, 615; 438/606
See application file for complete search history.

(56) References Cited

U.S. PATENT DOCUMENTS 6,278,136 B1 * 8/2001 Nitta ....................... H01L 33/32
257/103
6,287,947 B1 * 9/2001 Ludowise ............. H01S 5/0425
257/E33.07

(Continued)

FOREIGN PATENT DOCUMENTS

JP          11177134 A     7/1999
JP       20000353822 A    12/2000

OTHER PUBLICATIONS

Wampler, et al, Hydrogen Release From Magnesium-Doped GaN With Clean Ordered Surfaces, Journal of Applied Physics, vol. 94, No. 9, Nov. 1, 2003, p. 5682.

*Primary Examiner* — Mohammed Shamsuzzaman

(57) ABSTRACT

A device according to embodiments of the invention includes a semiconductor device structure (10) including a light emitting region (14) disposed between an n-type semiconductor region (16) and a p-type semiconductor region (12). A surface of the p-type semiconductor region (12) perpendicular to a growth direction of the semiconductor device structure (10) includes a first portion and a second portion. The first portion is less conductive than the second portion. The device further includes a p-contact (21) disposed on the p-type semiconductor region (12) and an n-contact (26) disposed on the n-type semiconductor region (16). The p-contact (21) includes a contact metal layer (20) and a blocking material layer (24). The blocking material layer (24) is disposed over the first portion and no blocking material layer (24) is disposed over the second portion.

11 Claims, 3 Drawing Sheets

(51) Int. Cl.
*H01L 33/20* (2010.01)
*H01L 33/14* (2010.01)
*H01L 33/22* (2010.01)
*H01L 33/40* (2010.01)
*H01L 21/324* (2006.01)
*H01L 21/322* (2006.01)
*H01L 21/02* (2006.01)

(52) U.S. Cl.
CPC ......... *H01L33/0095* (2013.01); *H01L 33/145* (2013.01); *H01L 33/20* (2013.01); *H01L 33/22* (2013.01); *H01L 33/40* (2013.01); *H01L 33/405* (2013.01); *H01L 21/0254* (2013.01); *H01L 21/02579* (2013.01); *H01L 21/02664* (2013.01); *H01L 2933/0016* (2013.01)

(56) References Cited

U.S. PATENT DOCUMENTS

| | | | |
|---|---|---|---|
| 7,439,609 B2 * | 10/2008 | Negley | H01L 21/2258 257/102 |
| 7,843,982 B2 * | 11/2010 | Chua | B82Y 20/00 372/49.01 |
| 9,136,424 B2 * | 9/2015 | Yoo | H01L 33/32 |
| 2002/0004254 A1 | 1/2002 | Miki et al. | |
| 2004/0222524 A1 | 11/2004 | Song et al. | |
| 2004/0245535 A1 | 12/2004 | D'Evelyn et al. | |
| 2011/0279054 A1 * | 11/2011 | Katona | H05B 37/02 315/291 |
| 2013/0240945 A1 * | 9/2013 | Aoki | H01L 33/0075 257/99 |

* cited by examiner

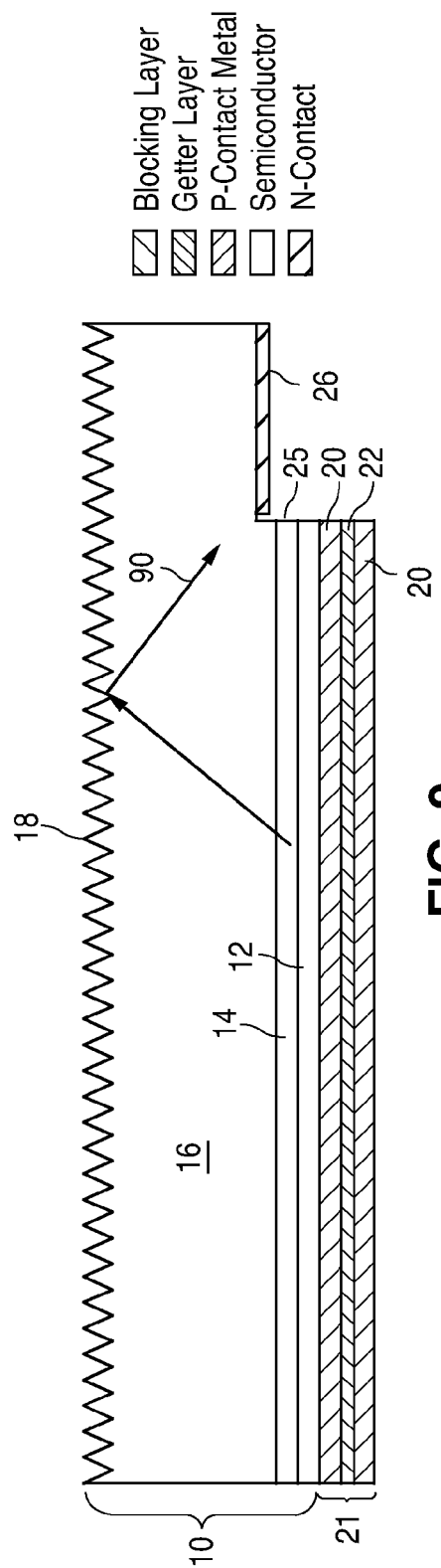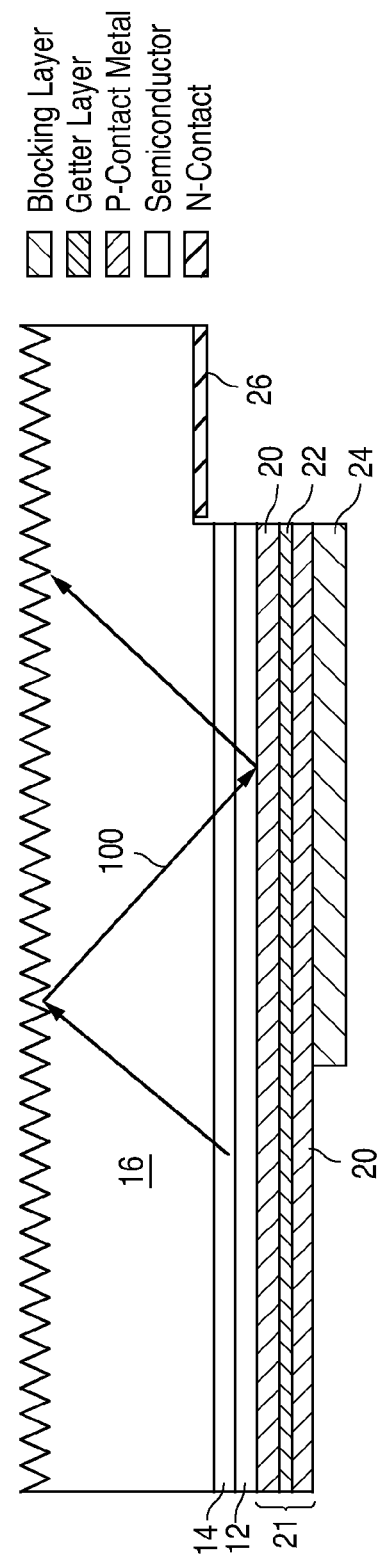

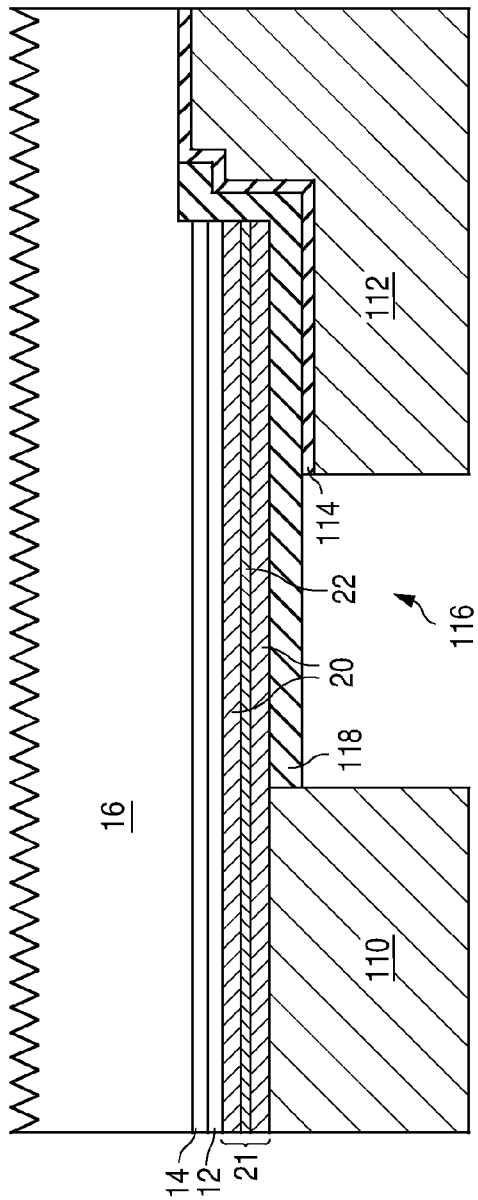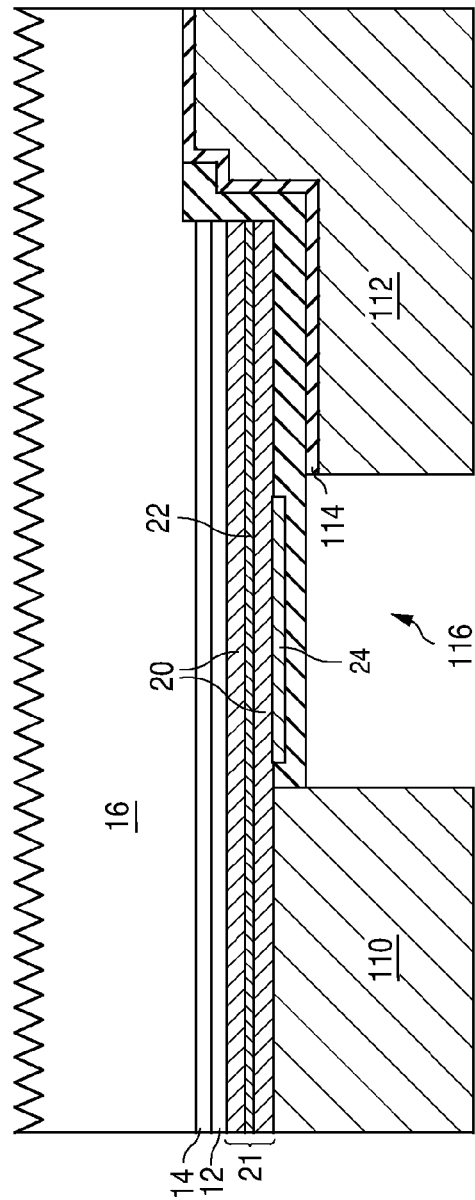

CONTROL OF P-CONTACT RESISTANCE IN A SEMICONDUCTOR LIGHT EMITTING DEVICE

CROSS-REFERENCE TO PRIOR APPLICATIONS

This application is the U.S. National Phase application under 35 U.S.C. §371 of International Application No. PCT/IB2014/058275, filed on Jan. 15, 2014, which claims the benefit of U.S. Patent Application Ser. No. 61/756107, filed on Jan. 24, 2013. These applications are hereby incorporated by reference herein.

FIELD OF THE INVENTION

The present invention relates to a method of controlling the p-contact resistance in a III-nitride device, and devices formed according to embodiments of the method.

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, quaternary, and quinary alloys of gallium, aluminum, indium, boron, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

As described by Wampler et al. in *Hydrogen release from magnesium-doped GaN with clean ordered surfaces*, J. Appl. Phys., Vol. 94, No. 9, P. 5682 (2003), "Mg-doped GaN, grown by metal-organic vapor phase epitaxy (MOVPE) has low conductivity due to passivation of acceptors by hydrogen (H) incorporated during growth. The passivation occurs through the formation of an electrically neutral Mg—H complex. The p-type conductivity required for devices is achieved through postgrowth activation of Mg by thermal annealing, which releases H from the material. However, the high anneal temperatures [above 700° C. . . . ], required to activate Mg acceptors, complicates device fabrication. . . . [A]ctivation does occur at lower temperatures when the GaN surface is coated with metal films, or when annealing is done in an oxidizing ambient."

SUMMARY

It is an object of the invention to provide a device including a p-type region where the conductivity may be engineered to improve the performance of the device.

A device according to embodiments of the invention includes a semiconductor structure including a light emitting layer disposed between an n-type region and a p-type region. A surface of the p-type region perpendicular to a growth direction of the semiconductor structure includes a first portion and a second portion. The first portion is less conductive than the second portion. The device further includes a p-contact formed on the p-type region. The p-contact includes a reflector and a blocking material. The blocking material is disposed over the first portion. No blocking material is disposed over the second portion.

A method according to embodiments of the invention includes partially activating the p-type region in a III-nitride structure comprising a light emitting layer disposed between an n-type region and a p-type region. After partially activating the p-type region, a metal p-contact is formed on the p-type region. The metal p-contact includes a first metal and a second metal. The first metal is reflective. After forming the metal p-contact, the p-type region is further activated.

BRIEF DESCRIPTION OF THE DRAWINGS

FIG. 9 illustrates a flip chip device.
FIG. 10 illustrates a flip chip device including a blocking material formed over part of the p-type semiconductor layer.
FIG. 11 illustrates a flip chip device including metal bonding pads.
FIG. 12 illustrates a flip chip device including metal bonding pads and a blocking material formed over part of the p-type semiconductor layer.

DETAILED DESCRIPTION

Though in the examples below the semiconductor light emitting devices are III-nitride LEDs that emit blue or UV light, semiconductor light emitting devices besides LEDs such as laser diodes and semiconductor light emitting devices made from other materials systems that require post-growth activation may be used.

Figure 1:
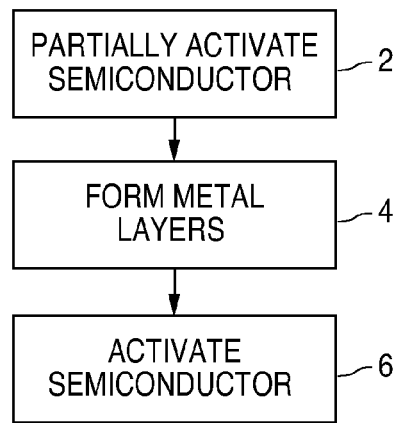
FIG. 1 illustrates a method of forming a p-contact.

In embodiments of the invention, post-growth processing to activate the p-type III-nitride material is used to engineer the conductivity of different parts of the device. FIG. 1 illustrates a method of forming a p-contact, according to embodiments of the invention. In step 2, a III-nitride semiconductor device structure is partially activated. The p-type region of the III-nitride semiconductor device structure is partially activated by annealing or by any other suitable technique that removes hydrogen.

The III-nitride semiconductor device structure is grown on a growth substrate, as is known in the art. The growth substrate may be any suitable substrate such as, for example, sapphire, SiC, Si, GaN, or a composite substrate. The semiconductor structure includes a light emitting or active region sandwiched between n- and p-type regions. An n-type region may be grown first and may include multiple layers of different compositions and dopant concentration including, for example, preparation layers such as buffer layers or nucleation layers, and/or layers designed to facilitate removal of the growth substrate, which may be n-type or not intentionally doped, and n- or even p-type device layers designed for particular optical, material, or electrical properties desirable for the light emitting region to efficiently emit light. A light emitting or active region is grown over the n-type region. Examples of suitable light emitting regions include a single thick or thin light emitting layer, or a multiple quantum well light emitting region including multiple thin or thick light emitting layers separated by barrier layers. A p-type region may then be grown over the light emitting region. Like the n-type region, the p-type region may include multiple layers of different composition, thickness, and dopant concentration, including layers that are not intentionally doped, or n-type layers. The last layer grown in the p-type region is often an Mg-doped GaN layer on which a metal contact is formed. Such a layer may be referred to as a p-type contact layer.

The p-type region of the III-nitride semiconductor device structure is partially activated in step 2 by annealing or by any other suitable technique that removes hydrogen. A conventional full anneal as referred to in the background section may be, for example, heating the structure in a 550° C. chamber for 1 hour. The partial activation referred to in step 2 may be an annealing step at a lower or temperature or for a shorter time, or a combination of shorter time and lower temperature. For example, in step 2, the semiconductor structure may be annealed by heating the semiconductor structure in a 500° C. chamber for 1 hour, or in a 550° C. chamber for 30 minutes. After the partial activation in step 2, the sheet resistance of the p-type layer on which the p-contact structure is formed may be twice the sheet resistance of the same p-type layer after a full anneal. After the partial activation of step 2, a metal layer disposed on the partially activated p-type contact layer cannot form a p-contact with sufficiently low contact resistance. The degree of hydrogen removal during a partial activation anneal may be adjusted by adjusting the temperature of the annealing step, the length of the annealing step, oxygen gas flow, and nitrogen gas flow during the annealing step.

In step 4 of FIG. 1, after the partial activation described in step 2, one or more contact layers are formed on the p-type region of the semiconductor structure. The contact layers are often metal, though they need not be. The contact layers may include a contact metal, a getter metal, and a blocking material. Any of the contact metal, the getter metal, and the blocking material may be a single metal layer, a single alloy layer, or a multi-layer stack. Specific configurations of these three layers are described below. The contact metal, getter metal, and blocking material are generally deposited then patterned in step 4.

The contact metal forms an Ohmic contact with the p-type contact layer. In some embodiments, for example in the case of a flip chip LED, the contact metal is also a reflector. Examples of suitable contact metals include silver and a multi-layer nickel silver structure.

The getter metal getters hydrogen. The getter metal does not form an alloy with the contact metal but an oxide of the getter metal may be used to getter hydrogen. Examples of suitable getter metals include Co, Ni, Fe, Cu, alloys of Co, Ni, Fe, Cu, or a multi-layer stack.

The blocking material is substantially impenetrable by oxygen, for example because it is sufficiently dense that it cannot be penetrated by oxygen, or because it reacts with oxygen preferentially over the getter metal. The blocking material may be a metal.

Examples of suitable blocking metals include Co, Ni, Fe, Cu, Ti, W, Pt, Au, Ir, Ru, alloys of Co, Ni, Fe, Cu, Ti, W, Pt, Au, Ir, Ru, or a multi-layer stack consisting of Co, Ni, Fe, Cu, Ti, W, Pt, Au, Ir, or Ru. Alternatively, a conductive oxide, such as indium tin oxide, zinc oxide, indium zinc oxide, fluorine doped tin oxide, or aluminium doped zinc oxide may be used as a blocking material instead of a blocking metal. Since activation by annealing is generally more effective in an oxidizing environment, the blocking material substantially prevents hydrogen from being released, or blocks hydrogen from being released from the p-type semiconductor material. Accordingly, p-type material under the blocking material generally exhibits poor conductivity.

Other metal layers that are known in the art and that are part of a conventional p-contact may be formed after the contact metal, getter metal, and blocking material are formed. For example, a guard metal which prevents electromigration of one or more of the other layers in the p-contact may be formed over the contact metal, getter metal, and/or blocking material. In particular, a TiW or TiW:N guard metal may be formed after the contact metal, getter metal, and/or blocking material, to prevent electromigration.

In step 6 of FIG. 1, after the contact layers are formed in step 4, the structure is treated to further activate the p-type semiconductor material. Any suitable activation technique may be used. Activation in step 6 is generally a second anneal, for example by heating the structure in a 200-400° C. chamber for 30 minutes. A second anneal in step 6 is often conducted at a lower temperature than a first anneal in step 2. The amount of activation of the p-type semiconductor material may be adjusted by adjusting the temperature of the second annealing step, the length of the second annealing step, the oxygen gas flow, and/or the nitrogen gas flow during the second annealing step. In some embodiments, the conditions of a second annealing step in step 6 depend on the amount of activation achieved in step 2. If the p-type material is only slightly activated in step 2, in step 6 a higher temperature anneal or a longer anneal may be performed, as compared to the case where the p-type material is more activated in step 2. For example, if the p-type material is only partially activated in step 2, an anneal in step 6 may be performed at a temperature 50 to 100° C. higher than the 200-400° C. anneal described above, and/or for 10 minutes to 1 hour longer than the 30 minutes described above.

FIGS. 2, 3, 4, 5, 6, 7, and 8 illustrate specific arrangements of the contact metal, the getter metal, and the blocking material. In each of FIGS. 2, 3, 4, 5, 6, 7, and 8 a portion of a semiconductor structure 10 is illustrated. The semiconductor structure includes a light emitting or active region 14 disposed between a p-type region 12 and an n-type region 16. The light emitting region 14 generally includes at least one InGaN light emitting layer. Typically the p-type semiconductor material at the top surface of the semiconductor structure is GaN.

Figure 2:
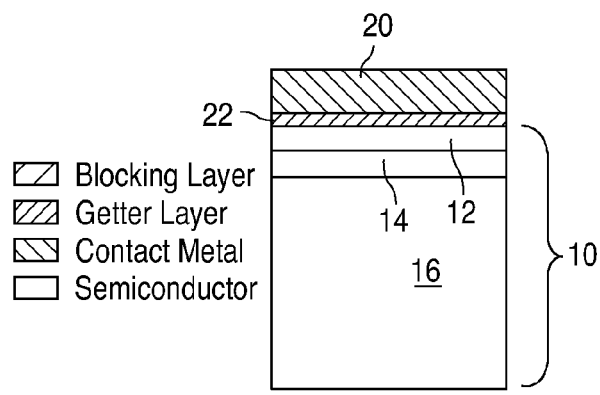
FIGS. 2, 3, 4, 5, 6, 7, and 8 illustrate arrangements of p-contact layers on a p-type semiconductor layer.
Figure 3:
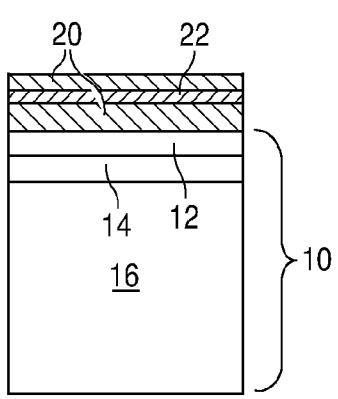
Figure 4:
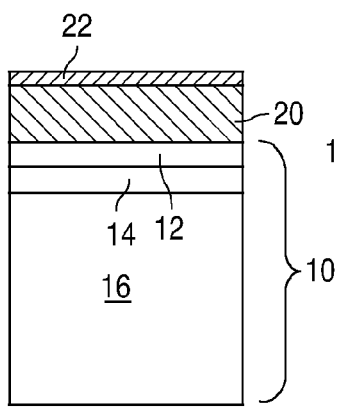

FIGS. 2, 3, and 4 include a contact metal 20 and a getter metal 22 without a blocking material. In the absence of a blocking material, p-contact resistance has no spatial dependence, meaning that the entire lateral extent of the p-type region 12 has the same contact resistance. The degree of activation can be controlled by (i) the degree of activation of the epitaxial material before any metals are deposited; (ii) the degree of activation after forming the metal layers 20 and 22; (iii) the degree of oxidation of the getter layer 22 during activation in block 6 of FIG. 1; and (iv) the location of the getter layer 22 relative to the contact metal 20. In FIG. 2, getter metal 22 is disposed in direct contact with the p-type semiconductor material 12 such that getter metal 22 is disposed between p-type region 12 and contact metal 20. In FIG. 3, getter metal 22 is disposed within contact metal 20, such that contact metal 20 is in direct contact with p-type semiconductor material 12. In FIG. 4, contact metal 20 is in direct contact with p-type semiconductor material 12 and getter metal 22 is disposed on the top surface of contact metal 20, i.e. the surface of contact metal 20 opposite p-type semiconductor material 12.

In the case where activation in step 6 is by an annealing step, getter metal 22 may be oxidized during the annealing step by flowing oxygen in the chamber during the annealing step. When the getter metal 22 is on top of the contact metal as in FIG. 4, the getter metal 22 is readily oxidized. When the getter metal 22 is buried, as in FIGS. 2 and 3, oxygen generally still reaches the getter metal through grain boundaries in the contact metal 20 covering the getter metal 22. The degree of oxidation can be controlled by anneal temperature, by anneal duration, by the amount of oxygen flowed into the chamber during the anneal, by the distance of the getter metal from the surface of the p-type region, and/or by the electro-negativity of the getter metal.

Figure 5:
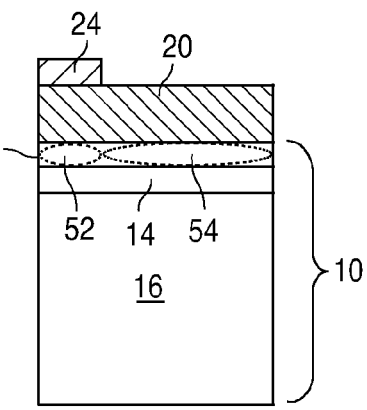

FIG. 5 includes a contact metal 20 and a blocking material 24 but no getter metal. The contact resistance in the p-type semiconductor material under the blocking material 24 can be tuned relative to the other p-type semiconductor areas by techniques (i) and (ii) listed above. For example, the p-type semiconductor material under blocking material 24 can be made with low conductivity by poorly activating the semiconductor structure before the contact metal 20 and blocking material 24 are formed, then further activating the semiconductor structure after the contact metal 20 and the blocking material 24 are deposited and patterned. The semiconductor material under the blocking layer has low conductivity because blocking material 24 prevents hydrogen from being removed from the semiconductor structure, but the optical reflectivity of contact metal 20 in the region of blocking material 24 is generally not affected by the low conductivity material under blocking material 24. Two adjacent regions in the p-type semiconductor material 12 are formed, a lower conductivity region 52 under blocking material 24, and a higher conductivity region 54 where no blocking material is formed. Unlike two p-type layers of different conductivity that are sequentially grown, such as a low conductivity p-type cladding layer followed by a high conductivity p-type contact layer, the two regions 52 and 54 of different conductivity are arranged laterally adjacent to each other, rather than vertically adjacent to each other as in the case of sequentially grown p-type layers. In other words, in the devices described herein including a blocking material 24, a surface of the p-type semiconductor material perpendicular to the growth direction includes a first portion of lower conductivity and a second portion of higher conductivity.

Figure 6:
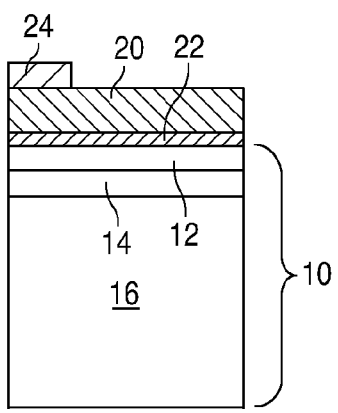
Figure 7:
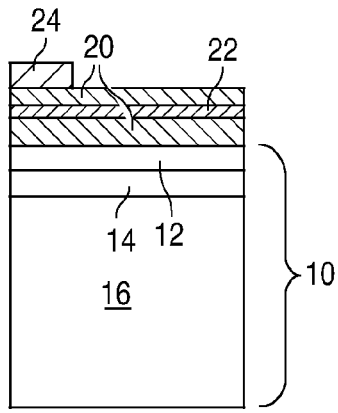
Figure 8:
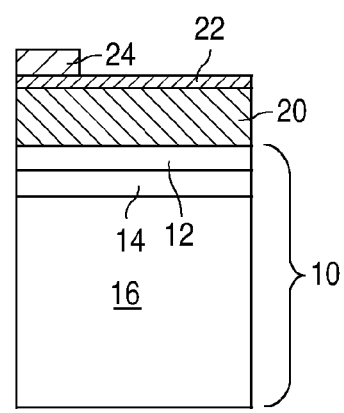

FIGS. 6, 7, and 8 include a contact metal 20, a getter metal 22, and a blocking material 24. In devices including both a blocking material 24 and a getter metal 22, the conductivity of the p-type semiconductor material under the blocking material 24 can be tuned relative to the other p-type semiconductor material by the techniques (i)-(iv) listed above. For example, the p-type semiconductor material under blocking material 24 can be made with low conductivity by poorly activating the semiconductor structure before the contact metal 20, getter metal 22, and blocking material 24 are formed, then further activating the semiconductor structure after the contact metal 20, getter metal 22, and the blocking material 24 are deposited and patterned. The p-type semiconductor material under the blocking material 24 has poor conductivity because blocking material 24 prevents hydrogen from being removed from the semiconductor structure and prevents getter layer 22 from oxidizing. The optical reflectivity of contact metal 20 is typically not affected by the low conductivity material under blocking material 24.

The use of a getter metal 22 in the structures illustrated in FIGS. 6, 7, and 8 provides some flexibility in the design of the other layers in the contact. For example, without an embedded getter metal 22 in the structures illustrated in FIGS. 2, 3, 6, and 7, the contact metal 20 cannot be too thick because for a given annealing condition and time, because hydrogen that must be removed to activate the p-type material can only go through a certain thickness of the contact metal 20. In the absence of a getter metal 22, if the contact metal 20 is too thick, the effect of the blocking material 24 is not felt. Since the getter metal 22 may be at the middle of the contact metal 20 as in FIG. 7, the contact metal 20 can be about twice as thick as without a getter metal, because oxygen can reach getter metal 22 from the top surface of the structure and hydrogen can diffuse to getter metal 22 from the semiconductor 12. In addition, the presence of both a getter metal 22 and blocking material 24 allows the use of a blocking layer which may not alone be dense enough to block hydrogen removal, but is able to reduce or prevent hydrogen removal by preventing the portion of the getter metal 22 underneath blocking material 24 from being oxidized, simply by being more readily oxidizable than the getter metal. In this case, since the getter metal 22 under the blocking material 24 cannot be oxidized, the p-type semiconductor layer 12 under blocking material 24 will generally exhibit low conductivity.

The getter metal 22 and blocking material 24 are generally used only to activate the p-type material. Getter metal 22 and blocking material 24 are not necessary to operate the finished device. Though not required to operate the device, getter metal 22 and blocking material 24 generally remain in the device after the activation described in FIG. 1 and accompanying text. In some embodiments, particularly in cases where getter metal 22 and/or blocking material 24 are formed on the top of contact metal 20, as in FIGS. 4, 5, 6, 7, and 8, one or both of blocking material 24 and getter metal 22 may be removed after the activation described in FIG. 1, for example by a selective etch.

FIGS. 9, 10, 11, and 12 illustrate applications of the ability to form a p-type region with regions of different conductivity.

FIGS. 9 and 10 illustrate flip chip devices. A portion of the p-type region 12 and the active region 14 are etched away to form a mesa 25 that exposes a portion of n-type region 16 on which an n-contact 26 is formed. The device is flipped relative to the growth direction of the semiconductor structure 10 such that the n-contact 26 and p-contact 21 are on the bottom of the semiconductor structure. The growth substrate is removed and the exposed surface 18 of the n-type region 16 is textured to improve light extraction. A majority of light extracted from the device is extracted through textured surface 18.

In the device illustrated in FIG. 9, since there is no blocking layer, the conductivity of the p-type region 12 is substantially the same throughout the p-type region such that light is generated evenly throughout the active region 14. As illustrated in FIG. 9, light 90 generated near the edge of the mesa 25 that is incident on textured surface 18 and scattered back into the semiconductor structure is at risk of being absorbed by n-contact 26 and lost.

In the device illustrated in FIG. 10, a blocking material 24 is formed in the area near mesa 25. During the activation in block 6 of FIG. 1, hydrogen will not be removed from the p-type region 12 aligned with blocking material 24 and this region will therefore exhibit poor conductivity. Current from p-contact 21 is preferentially injected away from the poor conductivity region such that little light is generated in this region, though p-contact 21 is still reflective in this region. Light 100 generated away from blocking material 24 is less likely to be absorbed and more likely to be extracted from the semiconductor structure through textured surface 18, as illustrated in FIG. 10.

FIGS. 11 and 12 illustrate flip chip devices with large metal bonding pads 110 and 112. The heat sinking capacity of the structures illustrated in FIGS. 11 and 12 may vary from area to area. For example, the structures illustrated in FIGS. 11 and 12 include two metal bonding pads, one 110 electrically connected to the p-contact 21 and one 112 electrically connected to the n-contact 114. The bonding pads are electrically isolated from each other and from other structures on the device by a dielectric region 118 and by a gap 116 between the two bonding pads 110 and 112. Bonding pads 110 and 112 typically remove heat from the device.

In the device illustrated in FIG. 11, since there is no blocking layer, the conductivity of the p-type region 12 is substantially the same throughout the p-type region such that light and consequently heat are generated evenly throughout the active region 14. Because the heat removal provided by bonding pads 110 and 112 is not available in gap 116, a hot spot may form in the semiconductor structure aligned with gap 116. Such hot spots may reduce the efficiency with which the active region emits light or may reduce reliability by thermally accelerating existing failure mechanisms.

In the device illustrated in FIG. 12, a blocking material 24 is formed in the area aligned with gap 116. During the activation in block 6 of FIG. 1, hydrogen will not be removed from the p-type region 12 aligned with blocking material 24 and this region will therefore exhibit poor conductivity. Current from p-contact 21 is preferentially injected away the poor conductivity region such that little light and therefore little heat are generated in this region, which may reduce the likelihood that a hot spot will be formed in the area of gap 116. The use of a blocking material as illustrated in FIG. 12 may prevent current from injecting into the junction where heat sinking is poorer, which may improve the overall reliability of the device.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

The invention claimed is:

1. A device comprising:
a semiconductor structure comprising a light emitting layer disposed between an n-type region and a p-type region, wherein a surface of the p-type region comprises a first portion and a second portion, wherein the surface is perpendicular to a growth direction of the semiconductor structure, wherein the first portion is less conductive than the second portion;
a p-contact formed on the p-type region, the p-contact comprising:
a reflector; and
a blocking material, wherein the blocking material is disposed over the first portion and no blocking material is disposed over the second portion; and
an n-contact formed on the n-type region;
a first metal bonding pad connected to the p-contact;
a second metal bonding pad connected to the n-contact; and
a gap disposed between the first and second metal bonding pads;
wherein the first portion is aligned with the gap.

2. The device of claim 1 wherein the p-contact further comprises a getter metal, wherein the getter metal getters hydrogen more readily than the reflector.

3. The device of claim 2 wherein the getter metal is disposed between the p-type region and the reflector.

4. The device of claim 2 wherein the getter metal is disposed within the reflector.

5. The device of claim 2 wherein the reflector is disposed between the p-type region and the getter metal.

6. The device of claim 2 wherein the getter metal comprises one of Co, Ni, Fe, Cu, an alloy of Co, an alloy of Ni, an alloy of Fe, and an alloy of Cu.

7. The device of claim 1 wherein the blocking material is a metal.

8. The device of claim 1 wherein the blocking material comprises one of Co, Ni, Fe, Cu, Ti, W, Pt, Au, Ir, Ru, a conductive oxide, indium tin oxide, zinc oxide, indium zinc oxide, fluorine doped tin oxide, aluminium doped zinc oxide, and an alloy of one of Co, Ni, Fe, Cu, Ti, W, Pt, Au, Ir, and Ru.

9. The device of claim 1 wherein:
the semiconductor structure comprises a mesa wherein a portion of the light emitting layer and p-type region are removed or not formed; and
the first portion is adjacent the mesa.

10. A semiconductor light emitting device comprising:
a semiconductor structure comprising a light emitting layer disposed between an n-type region and a p-type region, wherein a surface of the p-type region comprises a first portion and a second portion, wherein the surface is perpendicular to a growth direction of the semiconductor structure, wherein the first portion is less conductive than the second portion; and
a p-contact formed on the p-type region, the p-contact comprising:
a reflector; and
a blocking material, wherein the blocking material is disposed over the first portion and no blocking material is disposed over the second portion; wherein:
the blocking material is aligned with a first region of the light emitting layer and no blocking material is aligned with a second region of the light emitting layer;
the first region is aligned with a gap disposed between a first metal pad electrically connected to the n-type region and a second metal pad electrically connected to the p-type region; and
the first region emits less light than the second region.

11. The semiconductor light emitting device of claim 10 wherein a portion of the light emitting layer and p-type region are removed or not formed to form a mesa and the first portion is disposed between the mesa and the second region.

* * * * *